United States Patent
Ahmad et al.

[11] Patent Number: 6,147,506
[45] Date of Patent: Nov. 14, 2000

[54] WAFER TEST FIXTURE USING A BIASING BLADDER AND METHODOLOGY

[75] Inventors: Umar M. U. Ahmad, Hopewell Junction, N.Y.; Eugene R. Atwood, Housatonic, Mass.

[73] Assignee: International Business Machines Corporation, Armonk, N.Y.

[21] Appl. No.: 08/841,012

[22] Filed: Apr. 29, 1997

[51] Int. Cl.[7] .................................................. G01R 31/02
[52] U.S. Cl. ........................................... 324/760; 324/754
[58] Field of Search .................................... 324/760, 754, 324/755, 758, 765, 158.1

[56] References Cited

U.S. PATENT DOCUMENTS

| | | |
|---|---|---|
| 4,924,589 | 5/1990 | Leedy . |
| 4,926,117 | 5/1990 | Nevill ...................................... 324/760 |
| 4,968,931 | 11/1990 | Littlebury et al. . |
| 4,994,795 | 2/1991 | MacKenzie . |
| 5,020,219 | 6/1991 | Leedy . |
| 5,034,685 | 7/1991 | Leedy . |
| 5,047,711 | 9/1991 | Smith et al. . |
| 5,103,557 | 4/1992 | Leedy . |
| 5,210,485 | 5/1993 | Kreiger et al. . |
| 5,225,771 | 7/1993 | Leedy . |
| 5,241,266 | 8/1993 | Ahmad et al. . |
| 5,279,975 | 1/1994 | Devereaux et al. . |
| 5,440,241 | 8/1995 | King et al. . |
| 5,451,489 | 9/1995 | Leedy . |
| 5,457,400 | 10/1995 | Ahmad et al. . |
| 5,461,328 | 10/1995 | Devereaux et al. . |
| 5,483,175 | 1/1996 | Ahmad et al. . |
| 5,510,724 | 4/1996 | Itoyama et al. . |
| 5,559,446 | 9/1996 | Sano ........................................ 324/760 |
| 5,602,491 | 2/1997 | Vasquez et al. ........................ 324/760 |

*Primary Examiner*—Walter E. Snow
*Attorney, Agent, or Firm*—Ratner & Prestia; Aziz M. Ahsan

[57] ABSTRACT

A wafer test and burn-in fixture and methodology including a wafer probe having flexible tabs and a load board coupled to the wafer probe using the flexible tabs. The fixture also includes a bladder which biases the wafer probe to contact a wafer. A temperature control apparatus is provided to control the temperature of the wafer probe and the wafer. Tests are performed on the wafer using built-in self tests or wrap wiring tests.

37 Claims, 9 Drawing Sheets

WAFER TEST FIXTURE USING A BIASING BLADDER AND METHODOLOGY

FIELD OF THE INVENTION

This invention relates generally to electronic circuit testing devices and, particularly, to a wafer test and burn-in fixture and methodology.

BACKGROUND OF THE INVENTION

A large amount of activity in the microelectronics industry is directed toward developing methodologies for testing die on a wafer similar to the testing that is performed on a single chip package. Presently, burn-in and performance testing are performed on die that have been mounted onto a single chip carrier.

Tests are also performed on each die in a serial fashion. Serial testing of dice on a semiconductor wafer site-by-site is a time- and capital-consuming process. This wafer test process also is often insufficient for capturing faults and must be followed by additional testing once the dice are packaged. This process, particularly when combined with a burn-in requirement, leads to many repeated tests being performed on each die. Furthermore, dice are typically packaged before being thoroughly tested which adds cost to the final product because bad dice are not detected until the manufacturing process has been completed. In addition, problems in the manufacturing process or with the equipment used during manufacturing are not detected until the dice have been packaged and tested. As a result, numerous defective dice may be produced before problems with the manufacturing of such dice have been detected.

This problem is exacerbated because many companies that manufacture wafers send the wafers off shore to be packaged. When the packaged dice are returned, they are tested to determine whether the packages are acceptable. There may be a six-to-twelve week lag between the manufacturing of the dice and the packaging and testing of the packaged dice. Therefore, it may be several weeks before a problem is detected in the manufacturing process.

Testing dice on a wafer is difficult because of the large number of input/output (I/O) ports to be tested for the combined number of dice. It is difficult to form connections with each I/O on each of the die at the same time. Further, the electrical environment for making connections is poor. As a result, it is difficult to provide and receive data from even a single die at a rate greater than 50 to 60 MHz.

In addition, a large amount of thermal energy is produced when a large number of dice are operated at the same time. For example, if the wafer includes several hundred dice, each die can consume between 1 and 30 watts or more of power during operation. Further, if a die under test is shorted, the test probes could be destroyed when current is applied to the die.

It is an object of the present invention to solve these problems by using a wafer probe to test an entire wafer in parallel while minimizing test equipment costs and simultaneously providing a means for burn-in of dice on the wafer. It is another object of the present invention to provide current control to shorted devices in the parallel test environment. It is another object of this invention to enable "iddq" testing. It is still another object of the present invention to test the electrical performance of the dice using a combination of wafer fixturing and test methodology.

SUMMARY OF THE INVENTION

To achieve these and other objects, and in view of its purposes, the present invention provides a wafer test and burn-in fixture and methodology. The fixture includes a wafer probe including flexible tabs and a load board coupled to the wafer probe using the flexible tabs. The fixture also includes a bladder which biases the wafer probe to contact a wafer. A temperature control apparatus is provided to control the temperature of the wafer probe and the wafer. Tests are performed on each die on the wafer, in parallel, using built-in self tests and/or wrap wiring tests and/or other reduced pin test methodologies.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawings are not to scale. On the contrary, the dimensions of the various features are arbitrarily expanded or reduced for clarity. Included in the drawing are the following Figures.

DETAILED DESCRIPTION OF THE INVENTION

Overview

Figure 1:
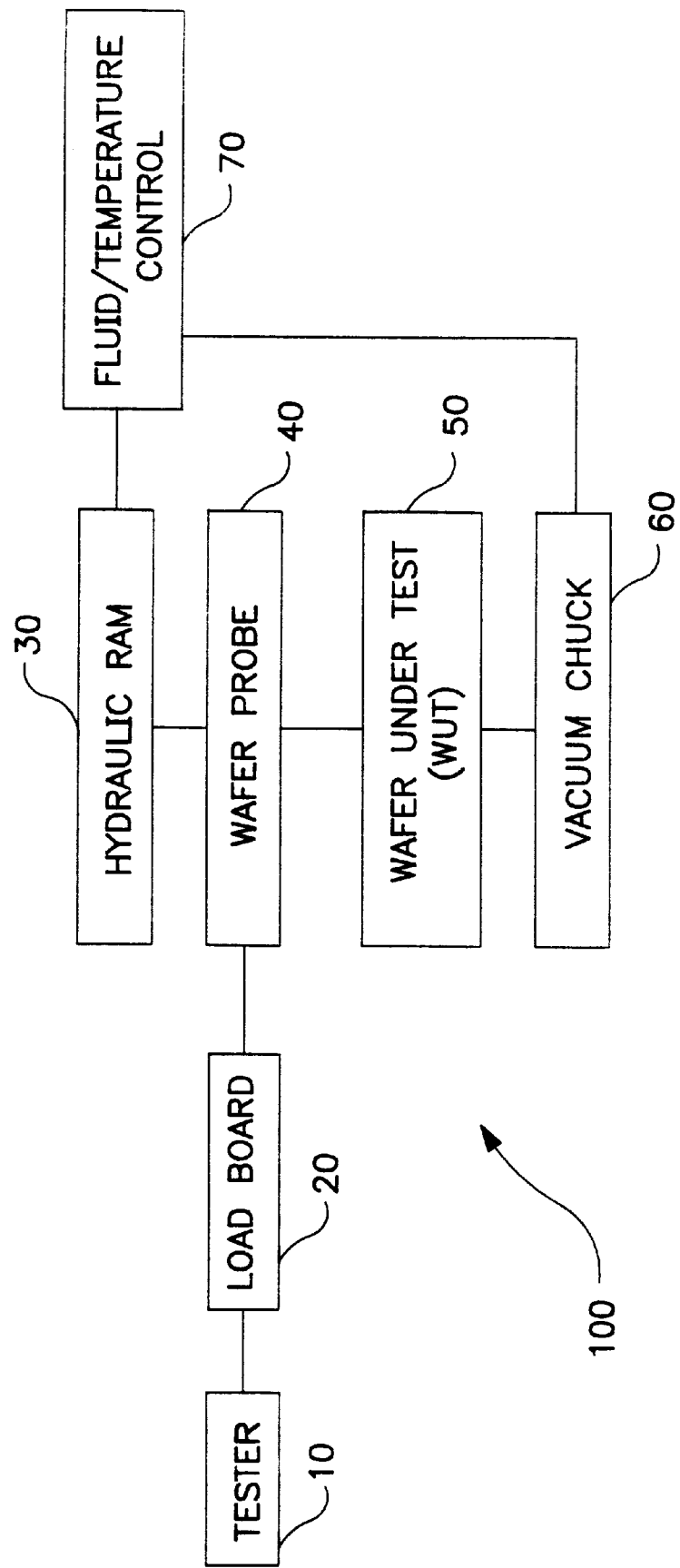
FIG. 1 is a block diagram of a wafer test and burn-in fixture according to an exemplary embodiment of the present invention.

Referring now to the drawing, wherein like reference numerals refer to like elements throughout the figures, FIG. 1 shows a wafer test and burn-in fixture 100 according to an exemplary embodiment of the present invention. The fixture 100 includes a hydraulic RAM assembly 30 which has an upper mounting block 310 and bladder 320 (shown in FIG. 2) for holding the wafer probe 40. The bladder 320 permits a static, evenly distributed, hydraulic load to be placed upon the backside of the wafer probe 40 to provide a uniform loading on the electrical contacts of the wafer under test (WUT) 50. A significant load is applied uniformly to all probe contacts of the wafer probe 40 because of the large number of electrical contacts that are to be made by the wafer probe 40 with the WUT 50.

The hydraulic RAM assembly 30, the wafer probe 40, the WUT 50, and the vacuum chuck 60 form a wafer probe assembly. The wafer probe assembly 30, 40, 50, 60 may be detached from the load board 20. Further, the wafer probe assembly 30, 40, 50, 60 allows the wafer probe 40 and the WUT 50 to be handled because the ram assembly 30 and the vacuum chuck 50 provide protection for the wafer probe 40 and the WUT 50. In addition, the wafer probe assembly 30, 40, 50, 60 may be moved between test fixtures.

Uniform loading of the contacts of the wafer probe 40 may be enhanced by thinning the wafer probe 40 by back-grinding. The thinner wafer probe 40 is more flexible, providing improved compliance between the contacts of the wafer probe 40 and the I/O ports of the WUT 50. Further improvements in compliance may be achieved by profiling the WUT 50 for topology and providing corresponding and matching topology on the wafer probe 40.

The wafer probe 40 includes large design rule NMOS or PMOS power Field Effect Transistors (FETs) and MOS decoupling capacitors used for controlling and filtering power to the die sites under test. For example, each die test site 420 (shown in FIG. 6) may include decoupling capacitors, terminating/pull-up/pull-down resistors, power FETs, and over-current sense and control circuitry. A die test site 420 is formed on the wafer probe 40 for each die on the WUT 50. Each WUT 50 has a plurality of dice.

The wafer probe 40 includes local level wiring used to connect die I/O ports to die I/O ports for at-speed wrap wiring driver or scan path style tests and global wiring to deliver test data, receive test data, distribute clock signals, and distribute power. The features and devices fabricated on the wafer probe 40 are interconnected using both the local and global wiring. The local wiring typically consists of 1 to 5 $\mu$m wide aluminum (Al) using SIMOX dielectric (deposited silicon.) The main uses of the local wiring is to provide "short" signal-to-signal interconnections within the die test site 420 for use by the at-speed wrap wiring test component of the test methodology and to form the structures required for fabrication of power FETS and other devices. The global wiring is a wide-field, thin-film, stack up, such as 25 $\mu$m copper (Cu) interconnection lines and polyamide dielectric. The global wiring provides power and signal distribution from the wafer probe 40 contact arrays 495 (shown in FIG. 8) to each die test site 420. The thin-film structure provides controlled impedance, low time of flight, and repairabilitiy.

The wafer probe 40 has a corresponding set of features formed using large lithography feature ground rules for each die on the WUT 50. Contacts 477 (shown in FIG. 2) are provided to contact die I/O ports. The contacts 477 can be formed as dendrites or plated elastomeric bumps. Provided along the periphery of the wafer probe 40 are a plurality of contacts used for connection to the load board 20. For example, five to ten input signals may be provided for each die test site 420 (shown in FIG. 8) with one to three output signals per die test site 420.

The load board 20 provides fan out of bussed control signals, including clock signals, to provide multiple capture channels for data, power distribution, filtering, and control; and terminal connections for the wafer probe 40 to load board 20 connections. The WUT 50 is mounted to a vacuum chuck 60 which serves as a rigid backing and as a controllable heat sink or heat source. Heat flow and the temperature of the WUT 50 and the hydraulic RAM assembly 30 are monitored and controlled by fluid circulating through galleries in the core of the vacuum chuck 60 and the hydraulic RAM assembly 30. The fluid/temperature control apparatus 70 provides fluid and temperature control.

The test methodology used by tester 10 and the wafer probe 40 includes a reduced pin test to allow for a reduced number of signal channels for each die site. The channels are limited to reduce the complexity and cost of the tester 10 and to reduce wiring density on the wafer probe 40. The test methodology has two, main components and is accessed through a reduced pin test access port. The test components are a built-in self test (BIST) and a built-in at-speed I/O wrap wiring test. In the BIST, a high coverage built-in self test for each die is accessed through a 1149.1 test access port or similar controls signals. The 1149.1 test access port is defined in Institute of Electrical and Electronics Engineers (IEEE) Standard 1149.1-1990 which is incorporated herein by reference.

Figure 6:
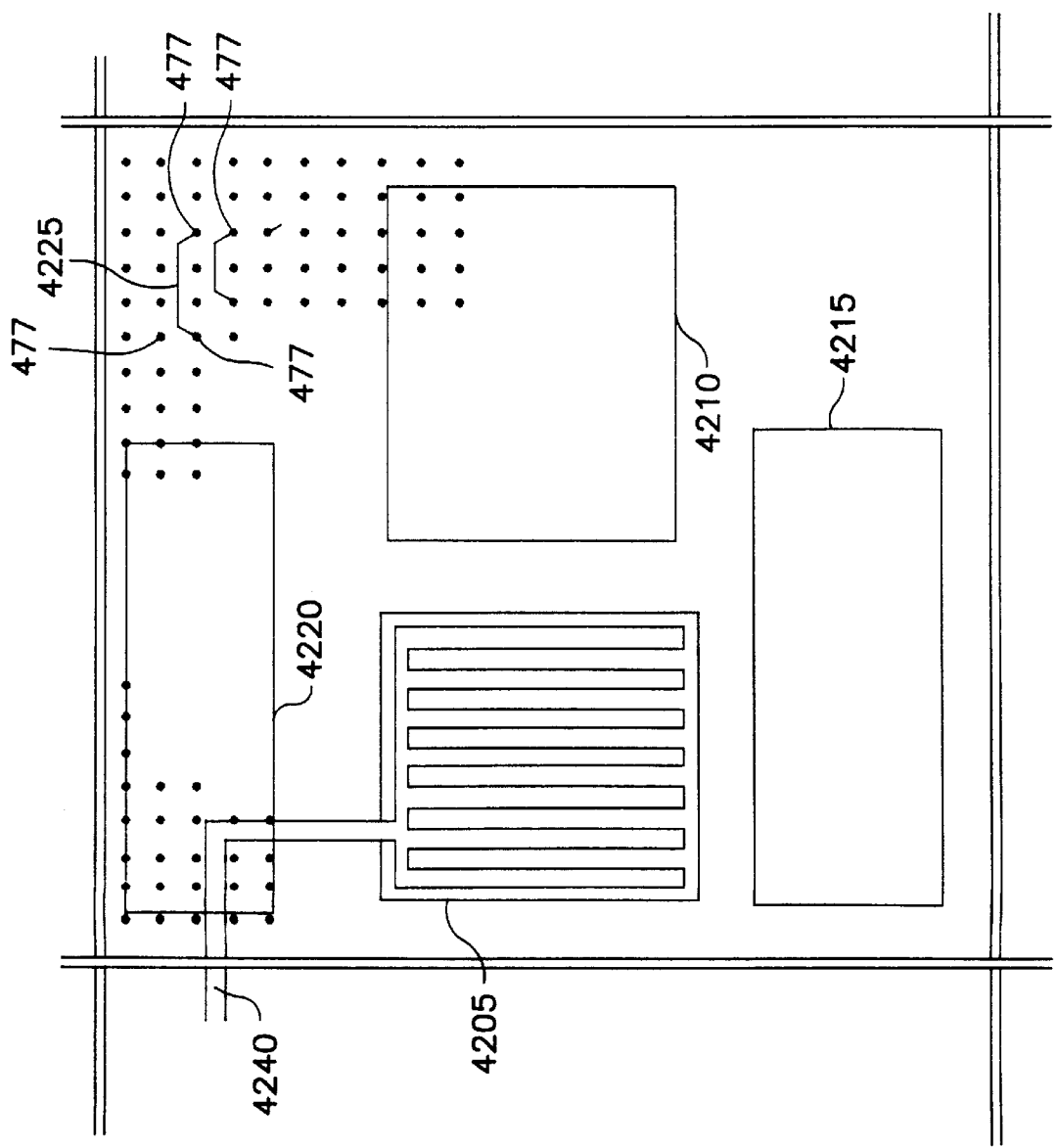
FIG. 6 is a schematic diagram of an exemplary die test site shown in FIG. 5.

The at-speed I/O wrap wiring test uses a state machine or micro code driven sequencer to drive drivers-to-receivers through the local "wrap" wiring located at each die test site 420 (shown in FIG. 6). The events are driven by the system clock and are latched appropriately to determine if large transistors used in the drivers or the sense transistors in the receivers of the die are slow to transition. The combination of an internal BIST and an external, built-in I/O wrap wiring test provides the basis for extensive test coverage.

Another type of test that may be performed is a I/O wrap test internal to the die. This is different from the at-speed wrap wiring test described above. In this I/O wrap test, the die enters a test mode. During the test mode, the latches that are used in the logic of the die to store values between combinational logic are formed into chains.

At some point, the chains implement a driver-to-receiver path which is subsequently exercised. This allows values to be scanned into a part of the chain, released into the combinational logic, and captured. In this way, each gate is tested to determine if it changes state. This indicates whether faults exist in the circuitry. This test does not require any I/O-to-I/O wrap wiring on the wafer probe.

The fluid/temperature control apparatus 70 controls the temperature of the vacuum chuck 60 and the hydraulic RAM assembly 30 to provide elevated temperature testing and burn-in. Depending on reliability requirements of the WUT 50, burn-in may be monitored or unmonitored. In either case, burn-in may be performed with minimal test equipment costs.

DESCRIPTION OF PREFERRED EMBODIMENTS

Figure 2:
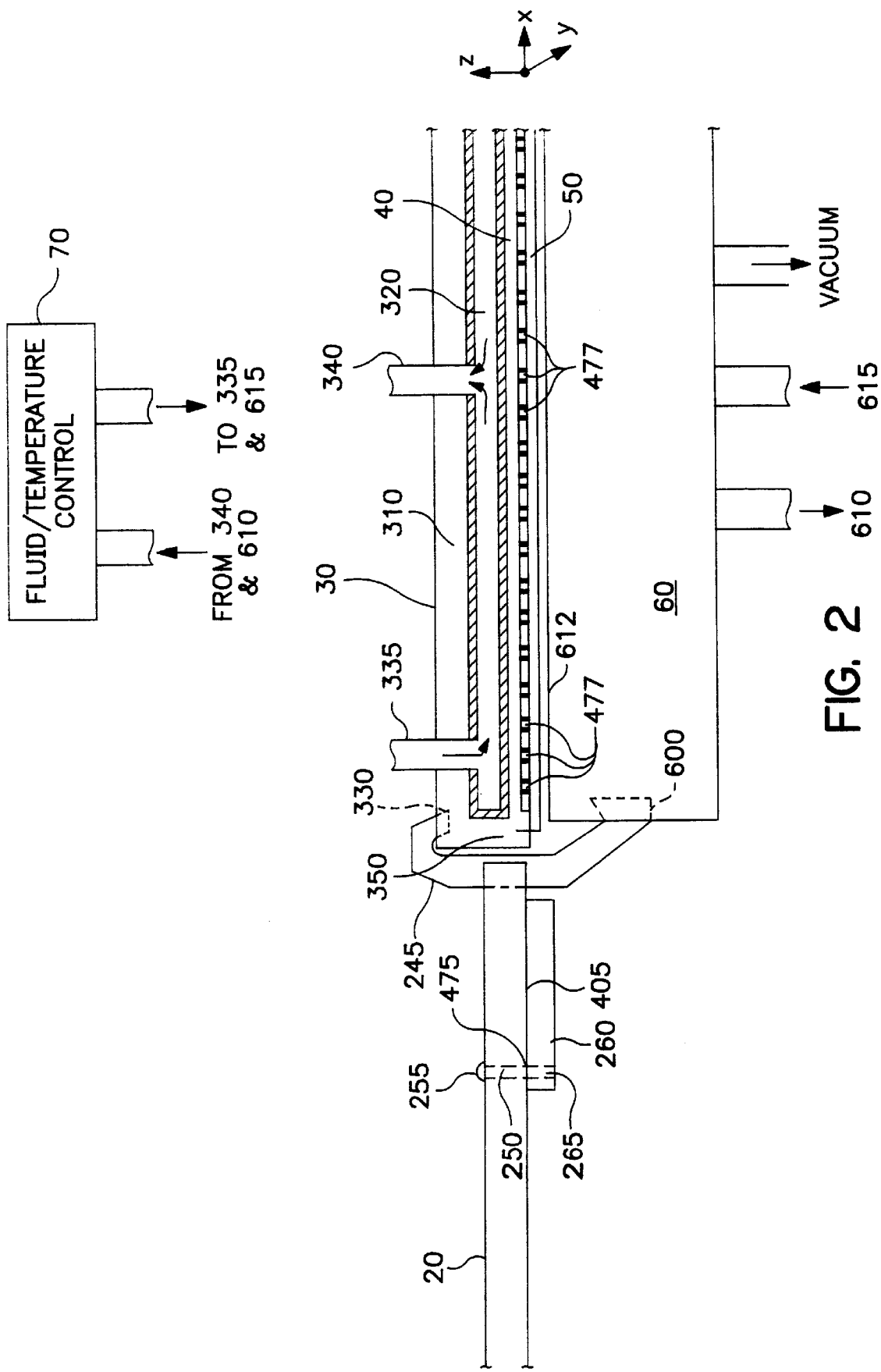
FIG. 2 is a schematic cross-sectional diagram of the wafer test and burn-in fixture according to an exemplary embodiment of the present invention.

FIG. 2 shows a wafer test and burn-in fixture 100 according to an exemplary embodiment of the present invention. The fixture 100 includes a load board 20 coupled to a wafer probe 40 used to make electrical contact with dice (not shown) on a WUT 50. The wafer probe 40 is supported along its edge by detent 350 formed in upper mounting block 310 of the hydraulic RAM assembly 30. The wafer probe 40 may be fixed in the detent 350 by an adhesive. The detent 350 is formed around the opening 205 (shown in FIG. 3).

A bladder 320 is formed in a cavity created by the wafer probe 40 and the upper mounting block 310. The contacts 477 formed on the wafer probe 40 are held in contact with the I/O ports of the WUT 50 by the force exerted by clamp 245 and the hydraulic load produced by the bladder 320. The bladder 320 permits a static, evenly distributed, hydraulic load to be placed upon the backside of the wafer probe 40. A small positive pressure is applied by the bladder 320 before the upper 310 and lower 60 blocks are brought together to avoid the application of a negative pressure which would draw the wafer probe 40 towards the upper mounting block 310.

The hydraulic RAM 30 assembly and the vacuum chuck 60 are aligned and held fixed together by clamps 245. Only one of the clamps 245 is shown in FIG. 2 for clarity. The other clamps 245 would be positioned around the hydraulic RAM assembly 30 and the vacuum chuck 60. The clamps 245 are, for example, C-shaped clamps, screws, or mechanical fasteners. For a C-shaped clamp 245, one end of the clamp is received in detent 330 formed in the hydraulic RAM assembly 30 and the other end is received in detent 600 formed in the vacuum chuck 60. The hydraulic RAM assembly 30 and the vacuum chuck 60 are held together by the spring force of the clamps 245. The detents 330 and 600 and the clamp 245 prevent the hydraulic RAM assembly 30 and the vacuum chuck 60 from rotating and moving apart. A gasket may be positioned between and around the periphery of the hydraulic RAM assembly 30 and the vacuum chuck 60 to provide non-slip, post-alignment stability and to minimize gas exchange. Gas exchange is not desirable since it may promote oxidation.

The WUT 50 is mounted to a vacuum chuck 60 which serves as a rigid backing and as a controllable heat sink or heat source. The vacuum chuck 60 is a metal plate that includes galleys for coolant or heatant. The vacuum chuck 60 also includes a vacuum galley with pin holes at the surface 612 to hold the WUT 50 firmly in place when suction is applied. The vacuum chuck 60 prevents the WUT 50 from warping or bending. The vacuum created by the vacuum chuck 60 allows stress to be released in the x-y plane when the vacuum chuck 60 and the WUT 50 expand or contract. The WUT 50 and the vacuum chuck 60 expand at different rates because the WUT 50 and the vacuum chuck 60 are constructed of different materials. Alternatively, the vacuum chuck 60 may be formed of a material which better matches the thermal coefficients of expansion of the wafer such as certain ceramics or KOVAR.

The fluid/temperature control apparatus 70 controls the pressure exerted by the bladder 320 and the temperature of bladder 320 via inlet port 335 and outlet port 340. The fluid/temperature control apparatus 70 also controls the temperature of the vacuum chuck 60 via inlet port 615 and outlet port 610. The temperature of these devices are controlled to heat, cool, or maintain the temperature of the WUT 50.

For example, the hydraulic RAM assembly 30, wafer probe 40, and the vacuum chuck 60 may be used to burn-in the die on the WUT 50. Burn-in is a process that accelerates the occurrence of defects that may be present in the circuitry located on the WUT 50 so that the defects occur during burn-in rather than as an early life failure. During burn-in, the WUT 50 is operated at an elevated temperature and voltage to accelerate latent defects. A general purpose Automatic Test Equipment (ATE) may be used as tester 10 (shown in FIG. 1) to drive the WUT 50. Alternatively, a reduced-cost piece of test equipment may be used to operate the WUT 50 because it may not be necessary to supply high speed test signals to the WUT 50 if an array built-in self test (ABIST), logic array built-in self test (LBIST) and/or I/O wrap test are implemented. The reduced-cost test equipment drives parallel channels for the dice on the WUT 50 in order to operate the dice in the elevated temperature and/or voltage environment. The fluid/temperature control apparatus 70 implements and controls burn-in conditions by maintaining the temperature of the bladder 320 and the vacuum chuck 60 in such a way as to control and maintain the desired temperature of the WUT 50.

The WUT 50 expands and contracts when it is heated or cooled. If the wafer probe 40 does not contract or expand to maintain compliance with the WUT 50, alignment of the wafer probe 40 to the WUT will not be maintained. In other words, the electrical connections formed between the WUT 50 and the wafer probe 40 may be difficult to control or may be lost if the WUT 50 and the wafer probe 40 expand or contract at different rates. To avoid this problem, the material of the wafer probe 40 is selected to have similar thermal expansion characteristics. Assuming that the WUT 50 is silicon, materials suitable for use as the wafer probe 40 are silicon or glass ceramic.

The wafer probe 40 is electrically connected to the load board 20 using tabs 405, clamping member 260, pins 255, and alignment guides 250, 475, and 265. Each tab 405 serves several purposes. First, each tab 405 provides fan out signal connectors 4950 (shown in FIG. 5) from a relatively fine pitch on the edge of the wafer probe 40 to a coarser pitch at the flexible circuit pads 415 (shown in FIG. 5) which form an electrical connection with the load board 20. The connection formed between the load board 20 and the wafer probe 40 via the tabs 405 may be a temporary connection. In other words, the wafer probe 40 may be disconnected from the load board 20. Second, the tabs 405 mechanically decouple the load board 20 and wafer probe assembly. Each of the tabs 405 is a flexible circuit material that allows greater misalignment.

Formed around opening 205 (shown in FIG. 3) are the alignment guides 250. The alignment guides 265 are formed in clamping member 260 and alignment guides 475 are formed in the tabs 405. When pins 255 are disposed in the alignment guides 250, 475, and 265, the flexible circuit pads 415 are aligned to the contact pads 417 (shown in FIG. 4) formed on the load board 20. The connectors 415 are held firmly in contact by the clamping member 260. The clamping member 260 may be fixed to the load board using clamps, pins, or any other structure that maintains pressure between the load board 20 and the clamping member 260.

Figure 3:
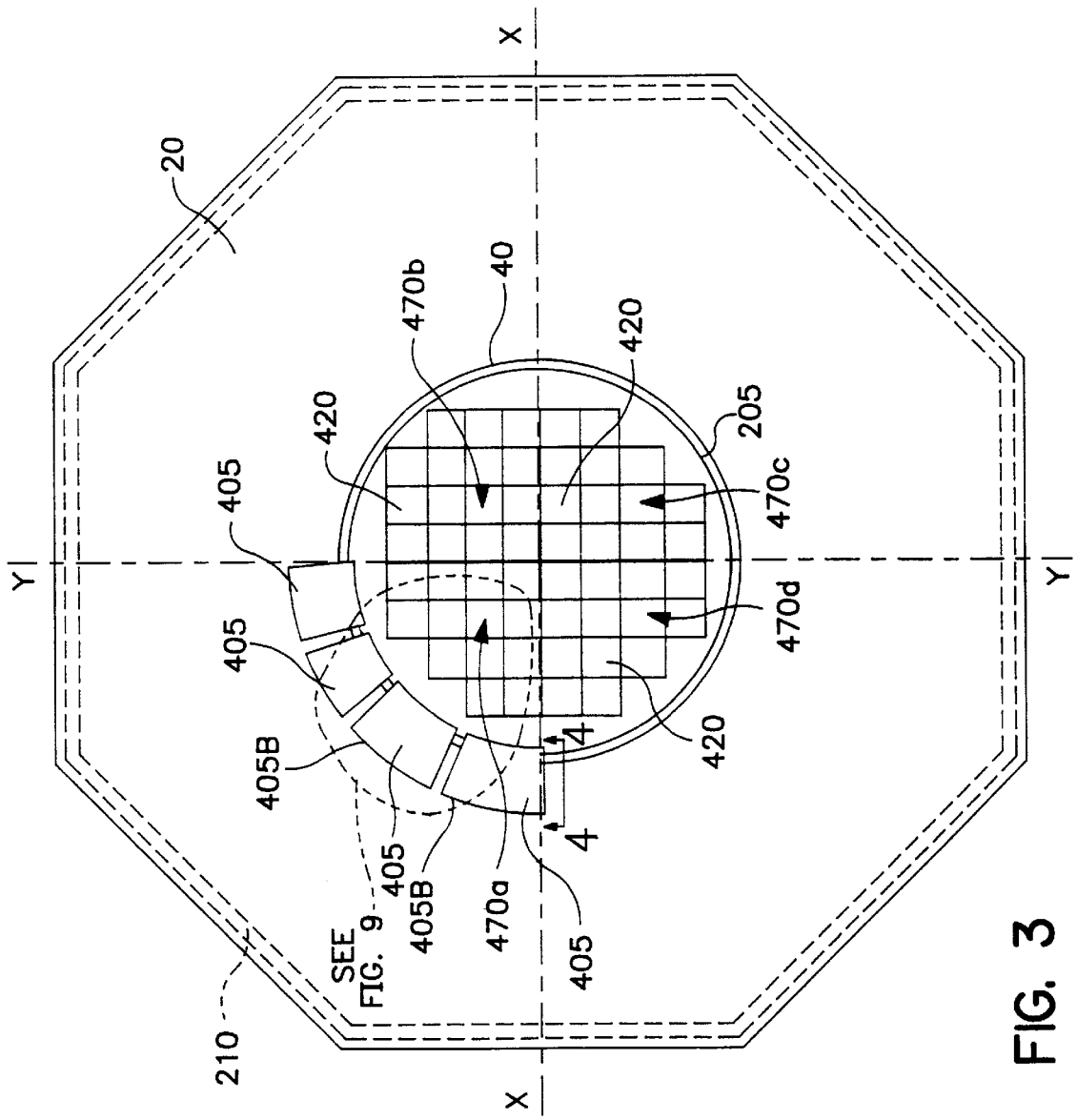
FIG. 3 is a schematic diagram of the load board and the wafer probe shown in FIG. 2.

Any misalignment of the wafer probe 40 and the load board 20 is neutralized by the flexibility of the tabs 405 (shown in FIG. 3). To aid in this process, the outer periphery 4058 (shown in FIG. 3) of the tabs 405 may be folded in an accordion pleat fashion 4000 (shown in FIG. 4). This configuration still permits the contacts on the tabs 405 to be compressed against the load board 20 using the clamping member 260, but provides much greater physical alignment compliance.

The tester 10 (shown in FIG. 1) is coupled to the load board 20 which provides, as required, signal fan out and redriving of the signals from the tester 10. The signals provided to and from the tester 10 are provided to the wafer probe 40 via the load board 20. The tester 10 also supplies a controlled power source for the load board 20 and wafer test apparatus and master controls for the actuation and operation of the fluid temperature controller 70 and vacuum controls.

Referring to FIG. 1, the tester 10 provides and receives test data from the WUT 50 via the wafer probe 40 and the load board 20. The tester 10 is a general purpose automatic test equipment (AUTOMATIC TEST EQUIPMENT) that may be used to test the circuitry on the WUT 50 or burn-in the circuitry on the WUT 50. The tester 10 may include numerous channels capable of operating at speeds of hundreds of megahertz or greater or the tester 10 may have a reduced number of channels functioning at lower operating speeds. An exemplary tester 10 is one that operates in accordance with the IEEE standard 1149.1-1990 which is incorporated herein by reference.

FIG. 3 is a schematic diagram showing the load board 20 and the wafer probe 40 in greater detail. Other components of the wafer test and burn-in fixture 100 have been omitted for clarity. Although the load board 20 is shown having an octagonal shape, the load board 20 may have any one of a number of different shapes. The load board 20 is typically placed in a fixture (not shown) and held in place by a vacuum. The vacuum also causes the contacts located in contact pads 210 on the load board 20 to form electrical connections with the contacts on the test fixture. There are a number of contacts located at the periphery of the load board 20 or distributed in an array on the underside of the load board.

The load board 20 is impedance matched to the test fixture and the wafer probe 40 to minimize discontinuities. Typically, the load board 20 is 70–120 ohms. The load board 20 may include delay matching circuitry to apply signals from the tester 10 to the wafer probe 40 at substantially the same time. The load board 20 also provides signal redriving and power distribution.

Placed at substantially the center of the load board 20 is the wafer probe 40. An opening 205 is formed in the center of the load board 20 to allow movement of the wafer probe 40 in the z-direction substantially perpendicular to the x and y directions.

The wafer probe 40 is coupled to the load board 20 by tabs 405. The tabs 405 are attached around the periphery of the wafer probe 40. Only four of the tabs 405 are shown in FIG. 3 for clarity. The tabs 405 are flexible and allow the wafer probe 40 to move in the z-direction relative to the load board 20 as well as accommodating horizontal alignment and motion. Although the tabs 405 are shown covering an arc of approximately fifteen degrees, the tabs 405 may be reduced or increased in size to allow greater flexibility or to accommodate connections provided on each tab 405. For example, the tabs 405 may cover an arc of approximately five degrees. The length of the tabs 405 from the wafer probe 40 to the load board 20 may be increased or decreased to increase or decrease the amount of flexibility of the wafer probe 40 with respect to the load board 20.

Figure 4:
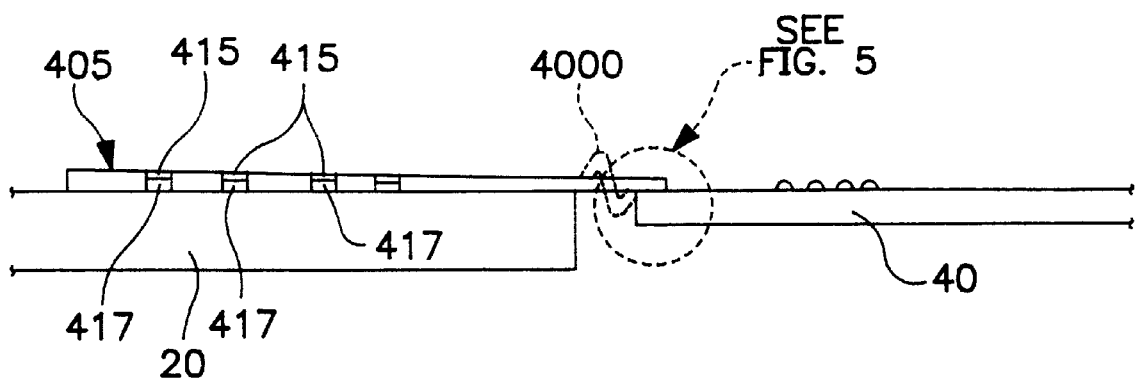
FIG. 4 is a schematic diagram of the load board, tab, and wafer probe along line 4—4 shown in FIG. 3.

Referring to FIG. 4, provided is a schematic view of the load board 20, tab 405, and wafer probe 40 along line 4—4 of FIG. 3. The tabs 405 are attached to the load board 20 by compression of the tabs 405 or the load board 20 contacts against contacts 417 on the load board 20 and the contacts 415 on the tabs 405. The load board 20 is fixed to the tabs 405 as is described above with reference to FIG. 2. The contacts 415 and 417 may be, for example, solder bumps, dendridic bumps, a compliant gold-plated bump, or a large non-compliant bump implementing a pad-on-pad connection scheme.

Figure 5:
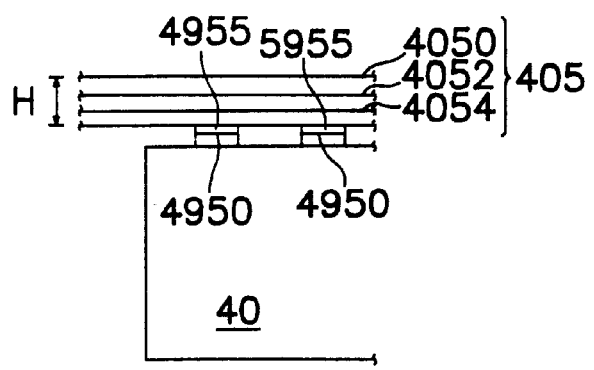
FIG. 5 is a schematic diagram of a section of the tab and wafer probe shown in FIG. 4.

Referring to FIG. 5, the tab 405 is attached to the wafer probe 40 by die bonding which is an ultrasonic bonding process. The wafer probe 40 contacts 4950 and the tabs 405 contacts 4955 are gold (Au) and are aligned and brought together. The weld is formed by applying heat and ultrasonic waves to the contacts 4950, 4955 while the wafer probe 40 is held in contact with the tabs 405. In addition to providing a mechanical bond, the contacts 4950, 4955 form an electrical connection so that power and data signals may be provided between the wafer probe 40 and the tabs 405.

The tabs 405 are a polymer metal film including, for example, copper 4050, polyamide 4052, and copper 4054. This film is flexible. Alternatively, the copper layers 4050 and 4054 may be replaced with aluminum or a low expansion coefficient alloy such as Kovar™. The layer 4054 forms a ground plane or power plane and the layer 4052 forms a signal plane. The height H of the tab 405 formed on the wafer probe 40 is typically less than 50 $\mu$m.

The material for the wafer probe 40 is chosen so the coefficients of expansion of the wafer probe 40 and the WUT 50 are substantially the same. In this way, the electrical connections formed between the wafer probe 40 and WUT 50 are not lost due to dissimilar rates of expansion and contraction during heating and cooling. For example, the wafer probe 40 may be silicon or a glass ceramic material.

The wafer probe 40 may be back-ground, or "thinned," to reduce the thickness of the wafer probe 40 to make it less rigid. For example, the wafer probe 40 may be 75 $\mu$m to 150 $\mu$m or 150 $\mu$m to 500 $\mu$m depending on the particular WUT 50 to be tested. The thickness of the wafer probe is selected to provide flexibility for the particular WUT 50. Thinning of the wafer probe accomplishes modest changes in how the wafer probe 40 deforms on a global basis. These deformations allow compliance of the wafer probe 40 globally to account for variations in the WUT 50 due to cupping and hollow grind. The primary compliance mechanism are the probe structures and probed sites themselves. As is known, the thickness of a silicon wafer may be reduced through chemmechanical polishing.

Figure 11:
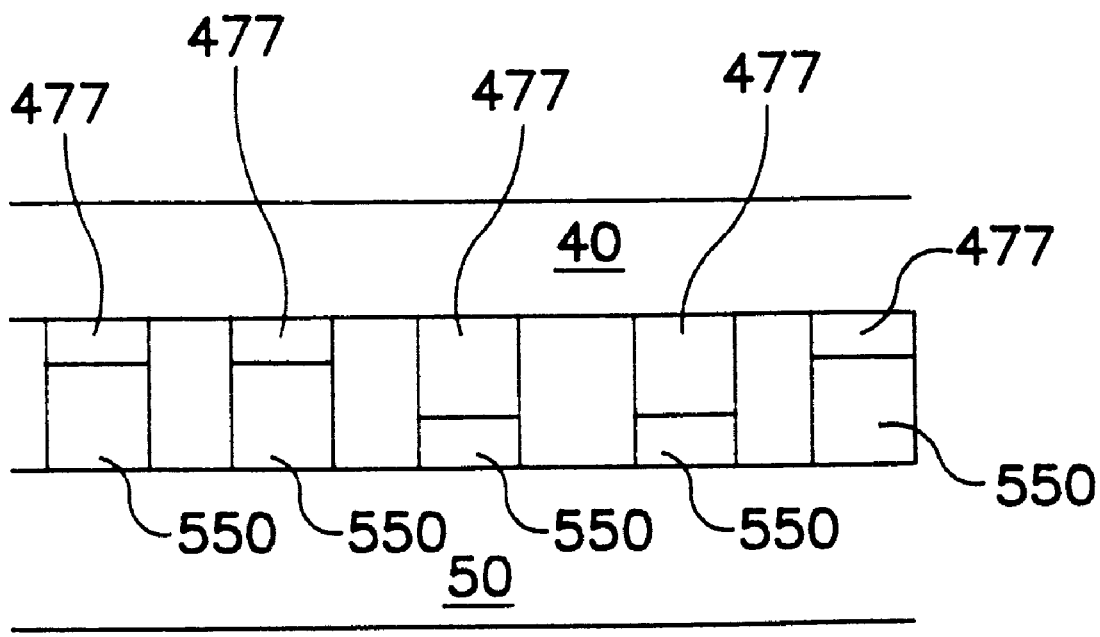
FIG. 11 is a schematic diagram illustrating the Z topology of the wafer probe 40.

The wafer probe 40 may also be patterned in such a way as to produce a local "Z topology" which matches that of the WUT 50. The matching Z topology is demonstrated in FIG. 11 where the height of the contacts 477 on the wafer probe 40 are adjusted to match the height of, for example, the pads 550 on the WUT 50. The design information for the wafer probe 40 is derived from the design of the WUT 50.

The probe contacts 477 (shown in FIG. 2) are selected on a case by case basis depending on the design and stage of manufacture of the WUT 50. For instance, dendrite contacts could be used for probe contacts 477 if the WUT 50 has solder bumps. The bumps typically provide up to 50 $\mu$ms of compliance. Alternatively gold plated elastomer probe contacts 477 may be type used for probing AU plated wirebond pads. These probes would provide compliance and also minimize the risk of accidental die bonds.

Returning to FIG. 3, the wafer probe 40 includes die test sites 420 which correspond to each of the die on the WUT 50. An exemplary die test site 420 is shown in FIG. 6. The die test site 420 includes a mirror contact structure corresponding to the I/O ports of the die. For example, contacts 477 contact different I/O ports on a die of the WUT 50. The contacts 477 provide power and other signals to the I/O ports of the die under test. The contacts 477 also receive signals from the WUT 50. The configuration of the contacts 477 is varied in response to the structure of the WUT 50. The contacts 477 are dendrite contacts or other compliant bump structures. The contacts 477 may also be a gold plated elastomeric bump structures such as those demonstrated by the Micro Electronics and Computer Technology Corporation (MCC).

The die test site 420 includes a power MOSFET 4205 for redriving the power provided from global power bus 4240. The power MOSFET 4205 may be controlled by a power control signal or automatic cut out circuitry that acts to prevent excess current from being supplied from the power MOSFET 4205 to the die under test. For example, the automatic cut out circuitry may include an over current sensor formed at each die test site 420 that shuts off power supplied by the power MOSFET 4205 if the current level supplied to the die under test exceeds a specified threshold.

Each die test site 420 may include I/O wrap wiring 4225 to connect one I/O port to another I/O port of the die under test for at-speed wrap wiring testing. In other words, the die test includes interconnection lines for connecting I/O ports of the die under test to each other for the at-speed I/O wrap wiring test. Whether the particular die site includes wrap wiring 4225 depends upon the type of tests performed on the die.

Each die test site 420 may include local decoupling capacitors 4210, 4215, and 4220 formed from thin-film or silicon-process capacitors. The decoupling capacitors are provided at each die test site 420 to limit the effects of sudden current surges caused by switching and operation of the die under test.

The wafer probe 40 may be provided with redundant components for each die test site 420 to increase the manufacturing yield of the wafer probe to one hundred percent. As opposed to a wafer that includes a number of dice that are eventually separated, the wafer probe operates as an entire unit. If one die test site 420 is not functioning, then a die on the WUT 50 corresponding to the malfunctioning die may not be tested. In order to avoid this problem, the components for each die test site 420 may be made redundant. For example, there may be two or more power MOSFET 4205 located at the die test site 420 in case one fails. The design rule of the wafer probe would also be large to increase the yield of the wafer probe 40. For example, the design rule would be five microns. If the probe site is malfunctioning, it may be repaired by local wiring alterations.

Figure 7:
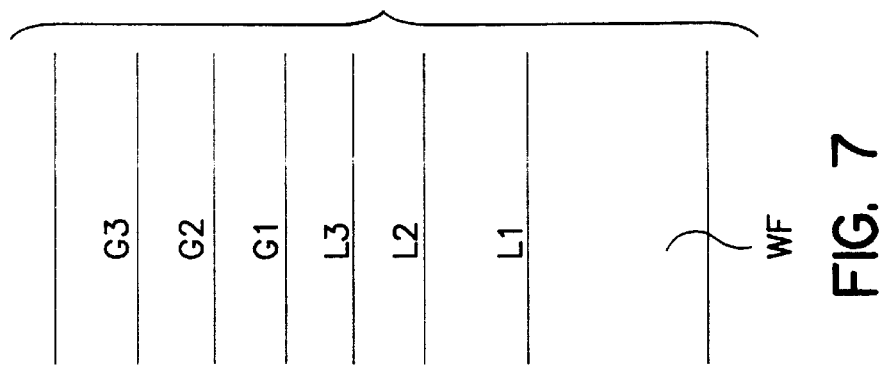
FIG. 7 is a schematic diagram illustrating the wiring stack up for the wafer probe shown in FIG. 3.

FIG. 7 is a cross sectional schematic diagram illustrating the wiring stack up for an exemplary wafer probe 40. The substrate WF is silicon using MOS based power FETS and capacitors. Formed on the substrate WF are three layers of local wiring L1, L2, and L3 for the die test site 420 (shown in FIG. 6). There may be two or more additional layers of local wiring (not shown). The number of layers of local wiring is determined by the number of interconnections provided to, from, and internal to each die test site 420.

Global wiring layers G1, G2, and G3 are included to provide power and input signals and to retrieve signals throughout the wafer probe 40. The global wiring layers G1, G2, and G3 distribute signals that are provided to either single or to a number of dice. The wafer probe 40 may be segmented into sections where each section is provided with a set of global wiring layers G1, G2, and G3 for distributing power and other data signals in that section. As shown in FIG. 3, the wafer probe 40 may be segmented into quadrants 470a, 470b, 470c, and 470d.

Figure 8:
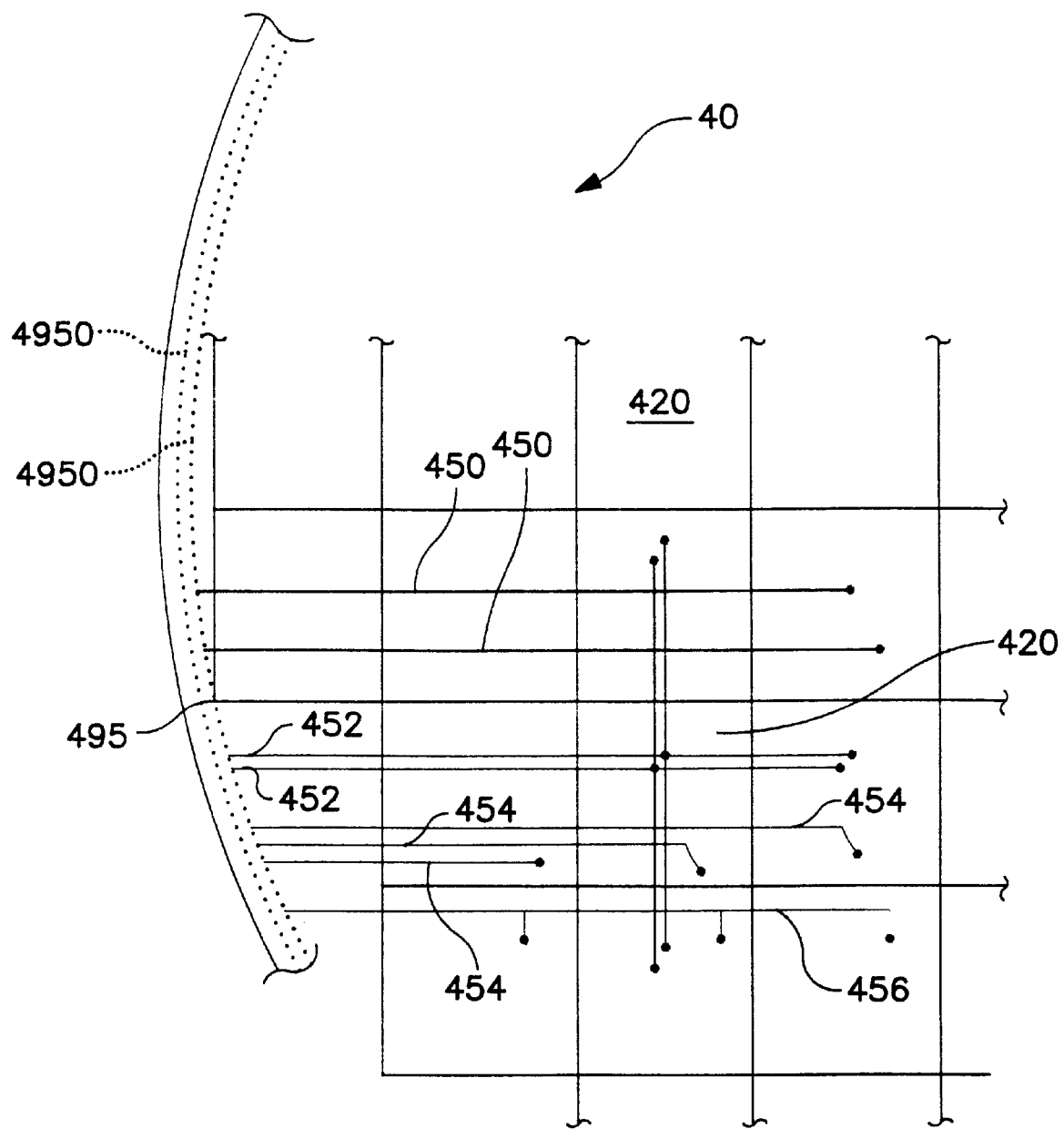
FIG. 8 is a schematic diagram of a section of the wafer probe shown in FIG. 3.

FIG. 8 shows exemplary global wiring from the contact array 495 to the die test sites 420. The contact array contains one, two or more rows of contacts 4950. Voltage and ground are provided from the contact array 495 to the die test sites 420 using a tri plate or other commonly used stack up thereby providing a controlled impedance environment. Global wiring may also include branching tree buses 452, discrete signal interconnections 454, and multi-drop nets 456. The branching tree network provides data signals to multiple die test sites 420 at substantially the same time. The discrete signal interconnections 454 provide discreet signals to individual die test sites 420.

For an eight inch WUT 50, there could be up to 2400 contacts 4950 for a one-row contact array 495. There would be up to 4800 contacts 4950 for a two row contact array 495. Alternatively, there three or more rows and/or partial rows. Approximately half of the interconnections may be provided for power distribution and control, and the other half of the interconnections may be provided for the transmission of signals. For example, two hundred and forty die test sites 420, there would be ten interconnection lines for providing signals to and from each die test site 420.

Figure 9:
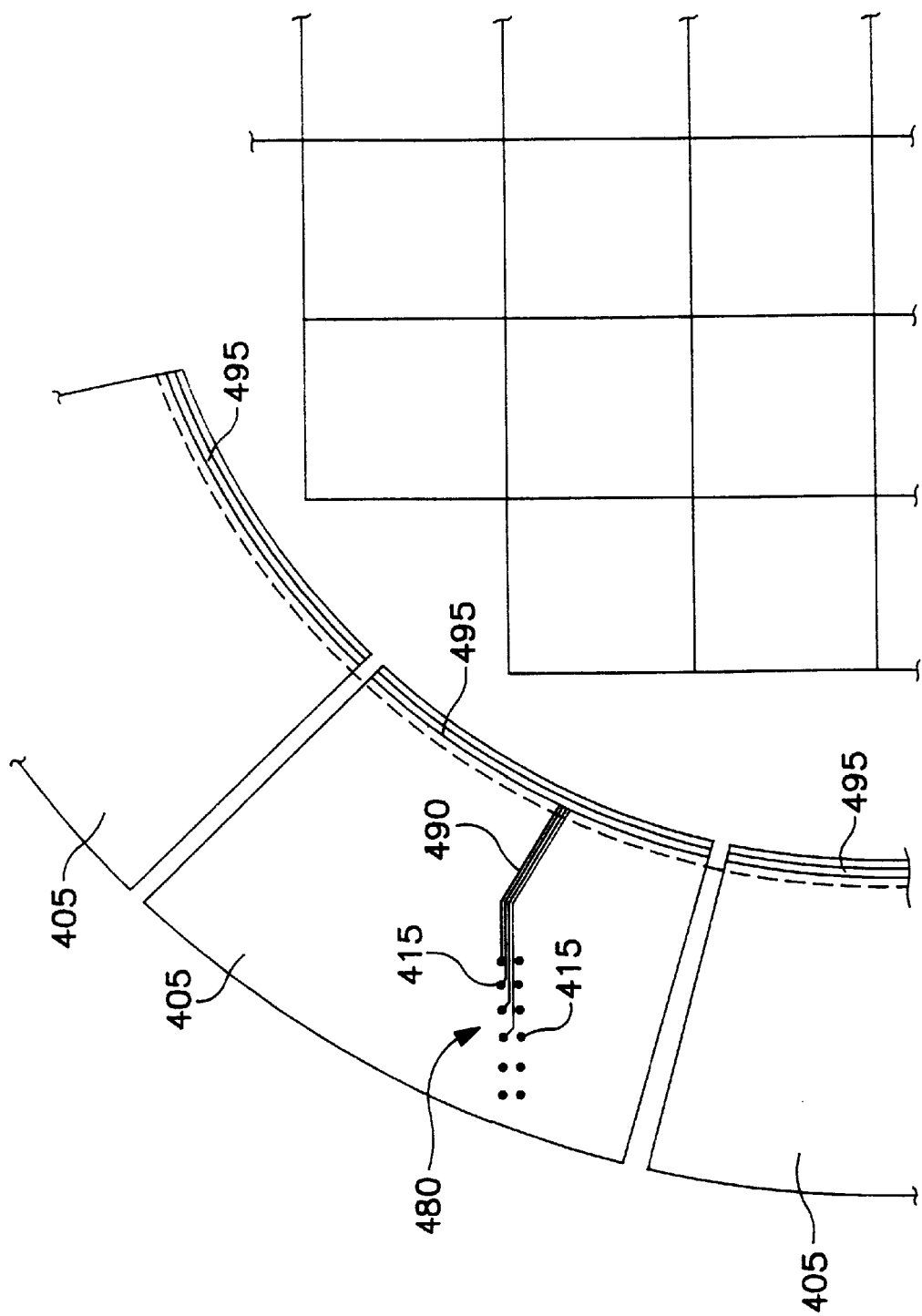
FIG. 9 is a schematic diagram of a section of the tab and the wafer probe shown in FIG. 3.

FIG. 9 shows the interconnection lines 490 on the tab 405 from the contact array 495 on the wafer probe 40 to bump array 480 including bump contacts 415. The contact array 495 are gold plated. The bump array 480 forms an electrical connection with the load board 20. The bump array 480, contact array 495, and interconnection lines 490 on the other tabs 405 have not been illustrated everywhere for clarity.

Each tab 405 may include a bump array 480, a contact array 495, and interconnection lines 490. The configuration of the bump array 480, the contact array 495, and the interconnection lines 490 may not be the same for each tab 405. For example, power may be distributed via a first tab 405 while discrete signals may be distributed using another tab 405. The load board 20 has a mirror image bump array including contacts 417 corresponding to bump array 480. The bump contacts 415 for tab 405 and the load board 20 are, for example, gold plated dendrites. The tabs 405 may be held in contact with the load board 20 using compression as is described above with reference to FIG. 2.

As is shown in FIG. 9, the interconnection lines 490 fan out from contact array 495 to bump array 480. The bump contacts 415 are spaced further apart to accommodate the wiring pitch on the load board 20. This configuration provides a flexible interface to account for stress and misalignment between the load board 20 and the wafer probe 40.

The operation of the fixture 100 is described below with reference to FIG. 10. At step 1000, the WUT 50 is placed in the vacuum chuck 60. At step 1010, the hydraulic RAM assembly 30 is fixed to the vacuum chuck 60 as described above. The hydraulic RAM assembly 30 and the vacuum chuck 60 are aligned using a split optic alignment technique which looks up and looks down at the same time to align the hydraulic RAM assembly 30 and the vacuum chuck 60 in the x-y plane. Once the hydraulic RAM assembly 30 and the vacuum chuck 60 are aligned, the two components are brought together by movement only along the z-axis.

At step 1015, the hydraulic RAM assembly 30 and vacuum chuck 60 are clamped. At step 1020, a hydraulic load is applied to the backside of the wafer probe 40 to ensure uniform loading on the electrical contacts between the wafer probe 40 and the I/O ports of the WUT 50. The hydraulic load and compliant probe structures eliminates the effect of spherical hollows, elliptical hollows, or other types of hollows due to imperfections in the global geometry of the WUT 50. The total value of the force applied by the hydraulic RAM assembly 30 may be in the range of 300 kg to 800 kg with an equivalent pressure of 98 kPa to 294 kPa. The static load is high because of the large number of probe points, where each probe point may require 4–20 ram force. A greater amount of ram force should be applied as the number of probe points increases.

At step 1030, the WUT 50 is tested using an iddq test, or a built-in self test (BIST), an at-speed wrap wiring BIST, LSSD based test or some other reduced pin test method. The fixture 100 is used to perform reduced pin tests on the WUT 50. Each of these tests may be driven through a reduced pin interface such as the 1149.1 interface defined in IEEE standard 1149.1-1990. These tests may include a built-in self test (BIST), at-speed wrap wiring driver built-in self test, logic BIST, array BIST or LSSD based test. The chosen tests depend upon the particular WUT 50 under test. An array BIST is used to test a memory structure or a regular structure of logic that is typical of memory. These structures are typically referred to as arrays. The logic BIST is used to test random logic that may be formed in an array-like manner but implements a specific function through the use of boolean logic.

A built-in self test can be operated at the clock speed of the chip because the chip generates the clock signal. The clock signal is produced in response to an external stimulus and the chip increases the speed of the stimulus by a multiple to operate the chip at a rapid speed. In this case, wrap wiring 4225 may be provided on the wafer probe 40 for wrapping output ports to input ports of a die on the WUT 50. The wrap wiring is provided for at-speed wrap wiring testing.

Another use of the wrap wiring, for example, is an LSSD-based chip design having many scan chains that can be set up as a "daisy chain" reducing the number of driven and controlled channels required for whole wafer test, burn-in, or both. This is an advantage because of a reduction in ATE resource requirements. In this case, the single chip tester can use its other channel resources to test die in parallel for a reduction of test time and capital expense. Further, the controlled impedance of the wafer probe 40 can more easily accommodate high speed I/O to I/O signals using the wrap wiring 4225 (shown in FIG. 8).

During iddq testing, the current drawn by the dice are tested. The dice are placed in a known state and it is determined if the dice are drawing current above a threshold. The dice are defective if the current exceeds the threshold. The dice are tested individually in parallel or serial procedure.

These tests may be performed at an elevated or reduced temperatures using the fluid/temperature control apparatus 70 to increase/decrease the temperature of the hydraulic RAM assembly 30 and the vacuum chuck 60. The elevated or reduced temperature testing is advantageous because certain faults may be detected by testing the die at temperature.

Figure 10:
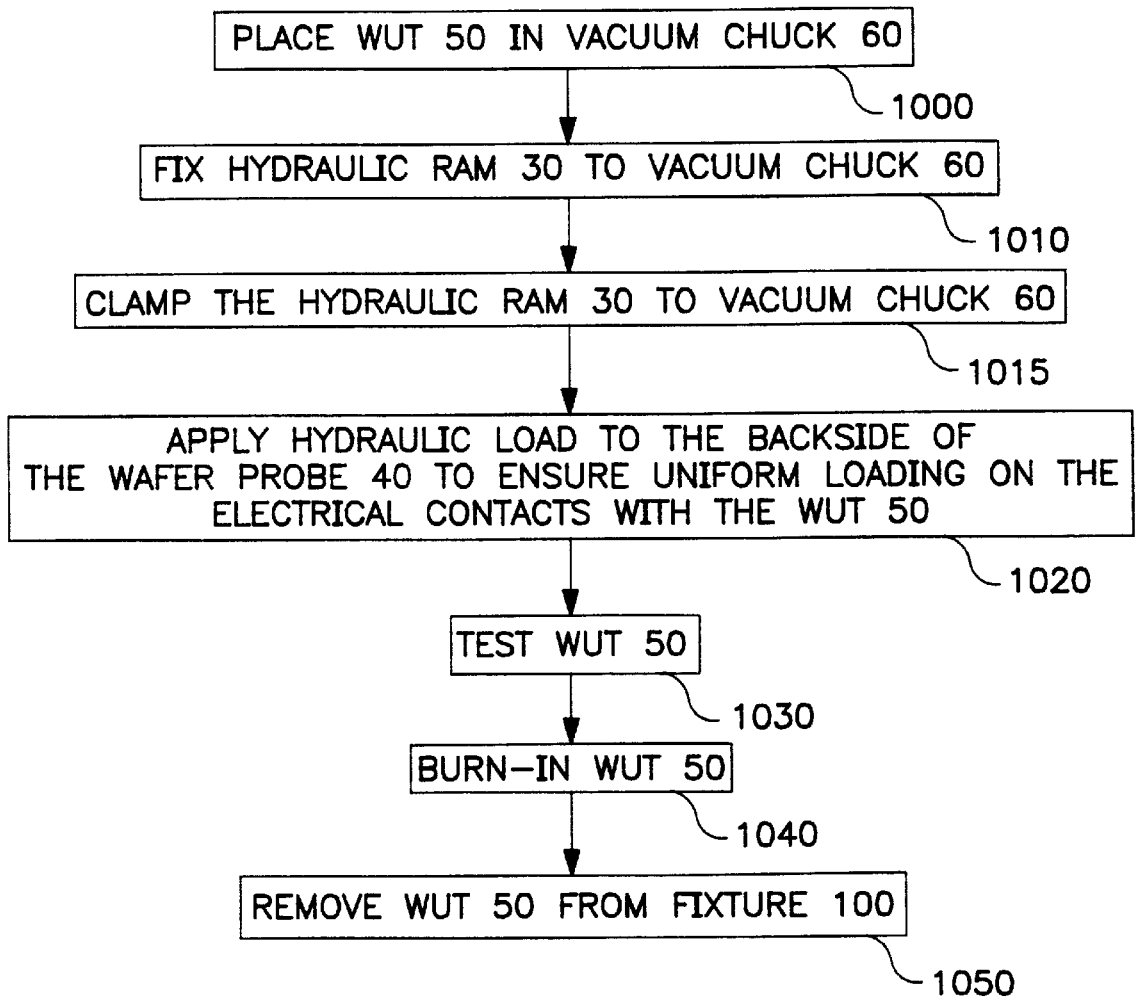
FIG. 10 is a flow chart diagram for illustrating the operation of the wafer test and burn-in fixture shown in FIG. 1.

At step 1040 in FIG. 10, the WUT 50 undergoes burn-in by elevating the temperature of the vacuum chuck 60 and the hydraulic RAM assembly 30. The other components of the fixture system 100 except for the probe assembly 30, 40, 50, 60 are not subjected to the increased temperature by elevating the temperature of the vacuum chuck 60 and the hydraulic RAM assembly 30. This avoids the creation of defects in the other portions of the fixture 100 such as the load board 20 caused by increased temperatures. Although the wafer probe 40 is subject to the elevated temperatures, the interconnection lines 490 and the circuitry formed on the wafer probe 40 are larger and more stable thermally than those formed on the WUT 50. In other words, the burn-in test is not as likely to cause defects in the wafer probe 40 as the WUT 50. This allows the wafer probe 40 to be used repetitively to test different WUTs 50.

Alternatively, the clamped wafer probe 40 and WUT 50, hydraulic RAM assembly 30, and vacuum chuck 60 may be removed from the load board 20 and handled as a single unit by removing clamping member 260 (shown in FIG. 2) and the probe assembly support (not illustrated). The single unit may be moved from one tester 10 to another tester 10. In this way, a lower cost tester 10 may be used to perform certain tests while a higher cost tester 10 may be used to perform other tests. Since the probe assembly 30, 40, 50, 60 is its own oven, lower cost test equipment can be used to effect burn-in. As a result, single units may be tested in parallel and lower cost equipment may be employed to perform testing. At step 1050, the WUT 50 is removed from the test fixture 100.

The wafer probe 40 may be used repetitively to test different WUTs 50 having similar designs. The wafer probe may be repaired when it becomes worn from the repeated uses. For example, contacts 477 may become worn. The wafer probe can be repaired by removing the surface features on the wafer probe 40 to obtain a planarized wafer. The surface includes, for example, contacts 477. The repair is completed by forming new surface features to produce a repaired wafer probe 40.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A test apparatus for testing a wafer comprising:
   a wafer probe of a material with substantially the same thermal expansion characteristics as the wafer being tested, the wafer probe including a plurality of flexible tabs of a flat shape and positioned generally horizontally between the load board and the wafer probe;
   a load board coupled to the wafer probe by the flexible tabs;
   a bladder for biasing the wafer probe; and
   testing means for testing the wafer using a reduced pin test methodology.

2. The test apparatus according to claim 1 wherein the testing means is further for testing the wafer during burn-in.

3. The test apparatus according to claim 1 further comprising temperature control means for controlling the temperature of the wafer probe and the wafer.

4. The test apparatus according to claim 3 wherein the temperature control means increases, decreases or maintains the temperature of the wafer probe and the wafer.

5. The test apparatus according to claim 1 wherein the wafer includes at least one die having input/output (I/O) ports and the wafer probe further comprises wrap wiring for interconnecting one I/O port of the die with another I/O port of the die.

6. The test apparatus according to claim 1 wherein the wafer has a plurality of dice and the wafer probe comprises a plurality of die test sites, each one of the plurality of die test sites corresponding to one of the plurality of dice.

7. The test apparatus according to claim 1 wherein the wafer probe comprises a plurality of die test sites, each one of the plurality of die test sites having at least one of a power source, a decoupling capacitor, and over current sense and control circuitry.

8. The test apparatus according to claim 7 wherein the power source is a field effect transistor.

9. The test apparatus according to claim 7 wherein the over current sense and control circuitry shuts down the power source if a current to a die on the wafer exceeds a threshold.

10. The test apparatus according to claim 7 wherein each one of the plurality of die test sites includes a power source and a decoupling capacitor.

11. The test apparatus according to claim 10 wherein the wafer includes at least one die having I/O ports and each one of the plurality of die test sites further includes wrap wiring for interconnecting one I/O port of the die with another I/O port of the die.

12. The test apparatus according to claim 10 wherein the power source is a field effect transistor.

13. The test apparatus according to claim 1 wherein the testing means includes means for testing the wafer using a reduced pin test methodology.

14. The test apparatus according to claim 1 wherein the test methodology includes at least one of an LSSD test, a built-in self test, and a wrap wiring test.

15. The test apparatus according to claim 1 further comprising means for holding the wafer probe and the wafer in alignment.

16. A test apparatus for testing a wafer comprising:
a wafer probe including flexible tabs, the wafer probe of a material with substantially the same thermal expansion characteristics as the wafer being tested;
a load board coupled to the wafer probe using the flexible tabs of a generally flat shape to be positioned horizontally between the load board and the wafer probe;
a bladder which biases the wafer probe to contact the wafer; and
temperature control means for controlling the temperature of the wafer probe and the wafer.

17. The test apparatus according to claim 16 further comprising testing means for testing the wafer using at least one of a built-in self test and a wrap wiring test.

18. The test apparatus according to claim 16 wherein the temperature control means increases the temperature of the wafer probe and the wafer.

19. The test apparatus according to claim 16 wherein the wafer includes at least one die having input/output (I/O) ports and the wafer probe further comprises wrap wiring for interconnecting one I/O port of the die with another I/O port of the die.

20. The test apparatus according to claim 16 wherein the wafer has a plurality of dice and the wafer probe comprises a plurality of die test sites, each one of the plurality of die test sites corresponding to one of the dice.

21. The test apparatus according to claim 16 wherein the wafer probe comprises a plurality of die test sites, each one of the plurality of die test sites having at least one of a power source, a decoupling capacitor, and over current sense and control circuitry.

22. The test apparatus according to claim 21 wherein the over current sense and control circuitry shuts down the power source if a current to a die on the wafer exceeds a threshold.

23. The test apparatus according to claim 21 wherein each one of the plurality of die test sites includes a power source and a decoupling capacitor.

24. The test apparatus according to claim 21 wherein the power source is a field effect transistor.

25. The test apparatus according to claim 21 wherein the wafer includes at least one die having I/O ports and each one of the plurality of die test sites further includes wrap wiring for interconnecting one I/O port of the die with another I/O port of the die.

26. The test apparatus according to claim 16 wherein the testing means includes means for testing the wafer using a reduced pin test methodology.

27. A method for testing a wafer comprising the steps of:
(a) providing a wafer probe which is of a material with substantially the same thermal expansion characteristics as the wafer being tested, the wafer probe including a plurality of flexible tabs for coupling the wafer probe to a load board, the flexible tabs being of a generally flat shape and positioned generally horizontally between the load board and the wafer probe;
(b) biasing the wafer probe to contact the wafer; and
(c) testing the wafer using at least one of a built-in self test and a warp wiring test.

28. The method according to claim 27 wherein step (c) further comprises the step of testing the wafer during burn-in.

29. The method according to claim 27 further comprising the step of (d) controlling the temperature of the wafer probe and the wafer.

30. The method according to claim 29 wherein step (d) includes the step of increasing the temperature of the wafer probe and the wafer.

31. The method according to claim 27 wherein the wafer probe provided in step (a) further comprises a plurality of die test sites, each one of the plurality of die test sites having at least one of a power source, a decoupling capacitor, and over current sense and control circuitry.

32. The method according to claim 20 further comprising the steps of:
providing a load board and flexible tabs; and
coupling the load board to the wafer probe using the flexible tabs.

33. The test apparatus according to claim 1, wherein the flexible tabs are flexible to the extent to permit the wafer probe to move in a generally vertical direction relative to the load board.

34. The test apparatus according to claim 1, wherein each flexible tab includes at least one of a bump array, contact array, and intersection lines for providing an electrical connection between the load board and the wafer probe.

35. The test apparatus according to claim 1, wherein each flexible tab has fan out signal connectors extending therefrom for electrical connection with the load board and thereby each flexible tab provides for misalignment between the load board and the wafer probe.

36. The test apparatus according to claim 16, wherein each flexible tab has fan out signal connectors extending therefrom for electrical connection with the load board and thereby each flexible tab provides for misalignment between the load board and the wafer probe.

37. The method according to claim 27 wherein each flexible tab has fan out signal connectors extending therefrom for electrical connection with the load board and thereby each flexible tab provides for misalignment between the load board and the wafer probe.

* * * * *

UNITED STATES PATENT AND TRADEMARK OFFICE
CERTIFICATE OF CORRECTION

PATENT NO. : 6,147,506
DATED : November 14, 2000
INVENTOR(S) : Umar M. U. Ahmad et al.

Page 1 of 1

It is certified that error appears in the above-identified patent and that said Letters Patent is hereby corrected as shown below:

Column 14, claim 32,
Line 26, delete "20" and insert -- 27 --.

Signed and Sealed this

Eighteenth Day of December, 2001

Attest:

*Attesting Officer*

JAMES E. ROGAN
*Director of the United States Patent and Trademark Office*